(12) United States Patent
Lee et al.

(10) Patent No.: US 9,357,646 B2
(45) Date of Patent: May 31, 2016

(54) PACKAGE SUBSTRATE

(71) Applicant: Samsung Electro-Mechanics Co., Ltd., Suwon (KR)

(72) Inventors: Sang Min Lee, Daejeon (KR); Moon Il Kim, Daejeon (KR); Yong Soon Jang, Cheongju (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 50 days.

(21) Appl. No.: 14/460,909

(22) Filed: Aug. 15, 2014

(65) Prior Publication Data

US 2015/0216048 A1     Jul. 30, 2015

(30) Foreign Application Priority Data

Jan. 29, 2014   (KR) ........................ 10-2014-0011218

(51) Int. Cl.
| | | |
|---|---|---|
| H01L 23/48 | (2006.01) | |
| H01L 23/52 | (2006.01) | |
| H01L 29/40 | (2006.01) | |
| H05K 1/11 | (2006.01) | |
| H01L 21/56 | (2006.01) | |
| H05K 3/30 | (2006.01) | |
| H05K 3/34 | (2006.01) | |
| H05K 3/28 | (2006.01) | |

(52) U.S. Cl.
CPC .............. *H05K 1/111* (2013.01); *H01L 21/563* (2013.01); *H05K 3/305* (2013.01); *H05K 3/3436* (2013.01); *H05K 3/28* (2013.01); *H05K 2201/048* (2013.01); *H05K 2201/09709* (2013.01); *H05K 2201/10977* (2013.01)

(58) Field of Classification Search
CPC .................. H01L 2224/1403; H01L 23/49513; H01L 2224/4903; H01L 21/563; H01L 2224/83192
USPC ................. 257/782, 783, 780, 781, 784, 786
See application file for complete search history.

(56) References Cited

U.S. PATENT DOCUMENTS

| | | | | |
|---|---|---|---|---|
| 6,608,372 B2 * | 8/2003 | Ikegami | .............. | H01L 23/3157 257/686 |
| 6,650,016 B1 * | 11/2003 | MacQuarrie | .......... | H01L 21/485 228/180.22 |
| 8,373,279 B2 * | 2/2013 | Lim | .................. | H01L 23/49548 257/737 |
| 2014/0124916 A1 * | 5/2014 | Yu | .......................... | H01L 21/565 257/737 |

FOREIGN PATENT DOCUMENTS

KR     10-2002-0028597     4/2002

* cited by examiner

*Primary Examiner* — S. V. Clark
(74) *Attorney, Agent, or Firm* — NSIP Law

(57) ABSTRACT

A package substrate includes an insulating layer; and circuit patterns formed on the insulating layer and divided into pad areas and pattern areas that have different heights. In one aspect, there can be a non-conductive paste (NCP) interposed between the circuit patterns and pads of a die connected to the circuit patterns to fix the die onto the insulating layer.

13 Claims, 3 Drawing Sheets

PACKAGE SUBSTRATE

CROSS-REFERENCE TO RELATED APPLICATIONS

This application claims the foreign priority benefit under 35 U.S.C. Section 119 of Korean Patent Application Serial No. 10-2014-0001 1218, entitled "Package Substrate" filed on Jan. 29, 2014, in the Korean Intellectual Property Office, which is hereby incorporated by reference in its entirety into this application.

BACKGROUND

1. Field

Embodiments of the present invention relate to a package substrate, and more particularly, to a package substrate capable of improving connection reliability at the time of mounting an electronic component thereon.

2. Description of the Related Art

Recently, substrates mounted in mobile devices have been thinned in accordance with gradual thinness of the mobile device. Performance of mobile application processors (APs) mounted on the substrate has been rapidly improved in accordance with multi-functionalization of the mobile device.

In accordance with the improvement of the performance of mobile APs, the number of pads corresponding to a large number of input and output terminals has been increased in a package substrate embedded in the mobile device. In addition, package substrates have been manufactured in a peripheral type pattern structure in order to simplify manufacturing and decrease manufacturing cost.

In this case, since the peripheral type patterns are configured at a fine pitch corresponding to the case in which a space between lines thereof is 20 pitches or less, a short-circuit may be generated between bumps at the time of assembling a package using a chip.

In order to prevent the short-circuit between the bumps at the time of assembling the package using the package substrate, a method of bonding a substrate and a chip to each other using a non-conductive paste (NCP) has been mainly used.

However, in the method of bonding a substrate and a chip to each other using a non-conductive paste (NCP) according to the related art, tin should be plated on surfaces of peripheral type bumps. Therefore, a plating process is added, such that the cost of the package substrate is inevitably increased. There is also a risk that pollution will occur on the plated surface after plating the tin, such that it is difficult to cope with an assembling defect for fine-pitch bumps.

CITATIONS

Korean Patent Laid-Open Publication No. 2002-0028597

SUMMARY

An aspect of the present invention is to provide a package substrate capable of coping with a fine pitch of circuit patterns and improving connection reliability at the time of mounting an electronic component thereon by fine-pitch circuit patterns.

According to an exemplary embodiment of the present invention, there is provided a package substrate including: an insulating layer; circuit patterns formed on the insulating layer and divided into pad areas and pattern areas that have different heights; and a non-conductive paste (NCP) interposed between the circuit patterns and pads of a die connected to the circuit patterns to fix the die onto the insulating layer.

The package substrate may further include a solder resist covering the insulating layer as well as some of the circuit patterns, and the pads formed on one surface of the die may be formed at positions corresponding to those of the pad areas of the circuit patterns.

The circuit patterns may be configured in a peripheral type, and the pad areas and the pattern areas may form a step therebetween, such that the pad areas have a height higher than that of the pattern areas.

The pad areas may be formed at end sides of the pattern areas.

The circuit pattern may include a plurality of circuits including the pad area and the pattern area and arranged in a row, wherein the respective circuits alternately have different lengths and are arranged in parallel with each other.

Circuits having a short pattern area length and circuits having a long pattern area length may be alternately disposed as the circuits, and sizes and lengths of the pad areas may be the same as each other, respectively.

Conductive adhesives may be interposed between only the pad areas of the circuit patterns and the pads of the die, such that the circuit patterns are electrically connected to the die, and a tin plating layer may be formed on the pads of the die rather than on the pad areas of the circuit patterns.

Upper surfaces of the pad areas of the circuits may be formed so as to have a surface roughness less than 0.5 µm.

According to another embodiment, a package substrate includes an insulating layer; circuit pattern areas formed on the insulating layer; and pad areas formed on the insulating layer, the pad areas being alternately disposed with the circuit pattern areas and having a height greater than that of the circuit pattern areas. In another aspect, this package substrate may be part of an assembly that also comprises a die having pads connected to the pad areas of the package substrate, the pads of the die being at positions corresponding to those of the pad areas of the package substrate.

Additional aspects and/or advantages will be set forth in part in the description which follows and, in part, will be apparent from the description, or may be learned by practice of the invention.

BRIEF DESCRIPTION OF THE DRAWINGS

These and/or other aspects and advantages will become apparent and more readily appreciated from the following description of the embodiments, taken in conjunction with the accompanying drawings of which.

DESCRIPTION OF EMBODIMENTS

The acting effects and technical configuration for the objects of a package substrate according to the present invention will be clearly understood by the following description in which exemplary embodiments of the present invention are described with reference to the accompanying drawings.

Figure 1:
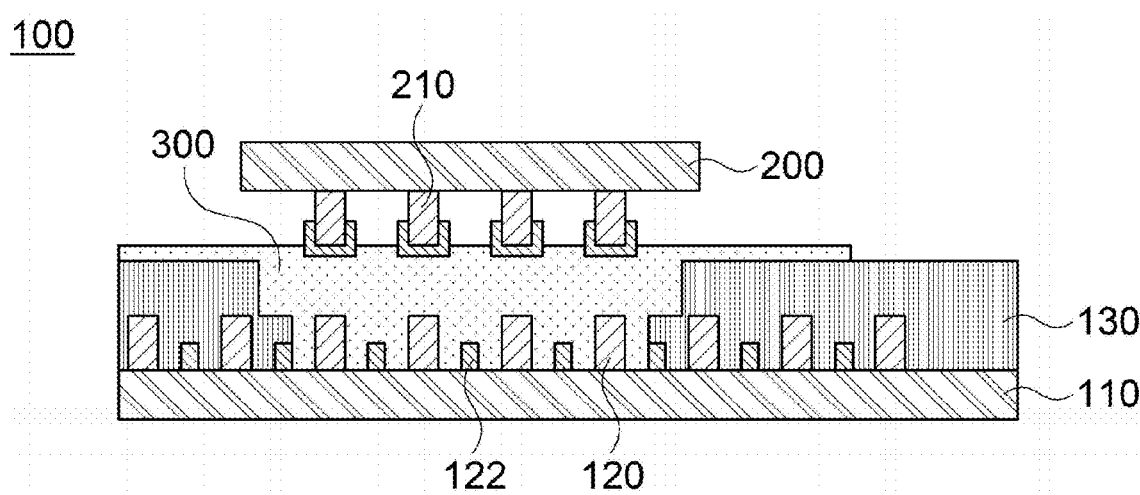
FIG. 1 is a cross-sectional view of a package substrate before being coupled to an electronic component according to an exemplary embodiment of the present invention.
Figure 2:
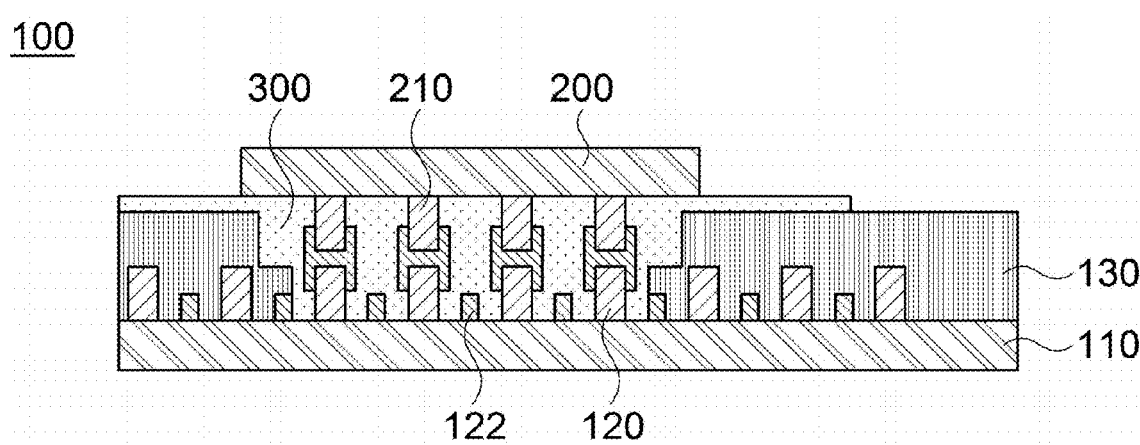
FIG. 2 is a cross-sectional view of the package substrate after being coupled to the electronic component according to an exemplary embodiment of the present invention.

First, FIG. 1 is a cross-sectional view of a package substrate before being coupled to an electronic component according to an exemplary embodiment of the present invention. FIG. 2 is a cross-sectional view of the package substrate after being coupled to the electronic component according to an exemplary embodiment of the present invention.

As shown in FIGS. 1 and 2, the package substrate 100 according to an exemplary embodiment of the present invention may be configured to include an insulating layer 110, circuit patterns 120 formed on the insulating layer 110, and a solder resist 130 covering the insulating layer 110 as well as some of the circuit patterns 120. An upper portion of the package substrate 100 may be provided with a die 200 including pads 210 formed at positions corresponding to those of the circuit patterns 120.

The package substrate 100 and the die 200 bonded thereonto may have a non-conductive paste (NCP) 300 interposed therebetween, such that the die 200 may be fixed onto the package substrate 100. The NCP, which is a non-conductive adhesive made of an insulating material, indicates a material containing a filler having a solder particle and configured in a paste form. In addition, the NCP 300 allows the circuit pattern 120 and the pad 210 to be bonded to each other and allows the circuit pattern and the pad bonded to each other to be insulated from each other depending on a feature of an insulating material.

The insulating layer 110 configuring the package substrate 100 may be a core of the substrate and be a plurality of insulating materials stacked on the core. In addition, components made of insulating materials stacked so that the circuit patterns 120 may be formed may be commonly called the insulating layer 110.

When the die 200 is surface-mounted on the package substrate 100 configured as described above, a conductive adhesive such as a solder is used on the circuit patterns 120 on the insulating layer 110 or the pads 210 of the die 200 to electrically couple the circuit patterns 120 and the die 200 to each other.

Figure 3:
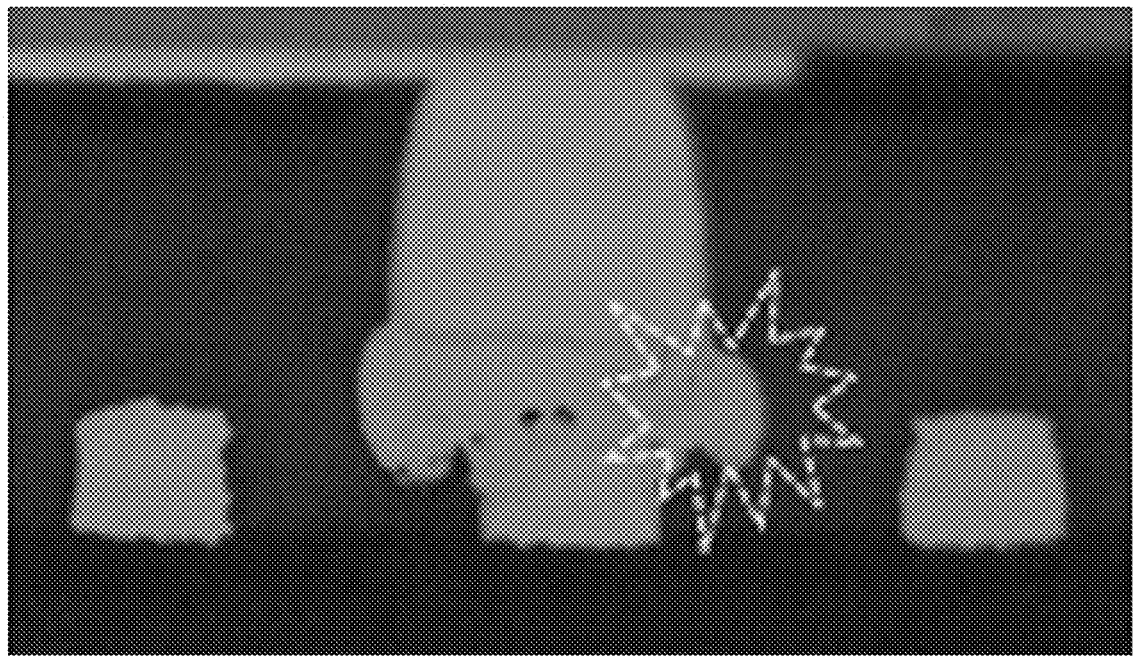
FIG. 3 is a photograph showing a cross section of the package substrate after being coupled to the electronic component.

Here, the circuit patterns 120 formed on the package substrate 100 are gradually configured at a fine pitch, such that an interval between the circuit patterns becomes narrow. Therefore, the conductive adhesive interposed between the circuit patterns 120 and the die 200 is leaked to the outside, such that the conductive adhesives may contact each other, thereby making it possible to generate a short-circuit (See FIG. 3).

Therefore, when the circuit patterns 120 of the package substrate 100 are configured at the fine pitch, it is useful to lower a height of the circuit patterns 120, and it is also useful to design the circuit patterns 120 so as to be electrically connected to the pads 210 of the die 200 while lowering the height of the circuit pattern 120. A design structure of the circuit pattern will be described in more detail with reference to FIGS. 4 and 5.

Figure 4:
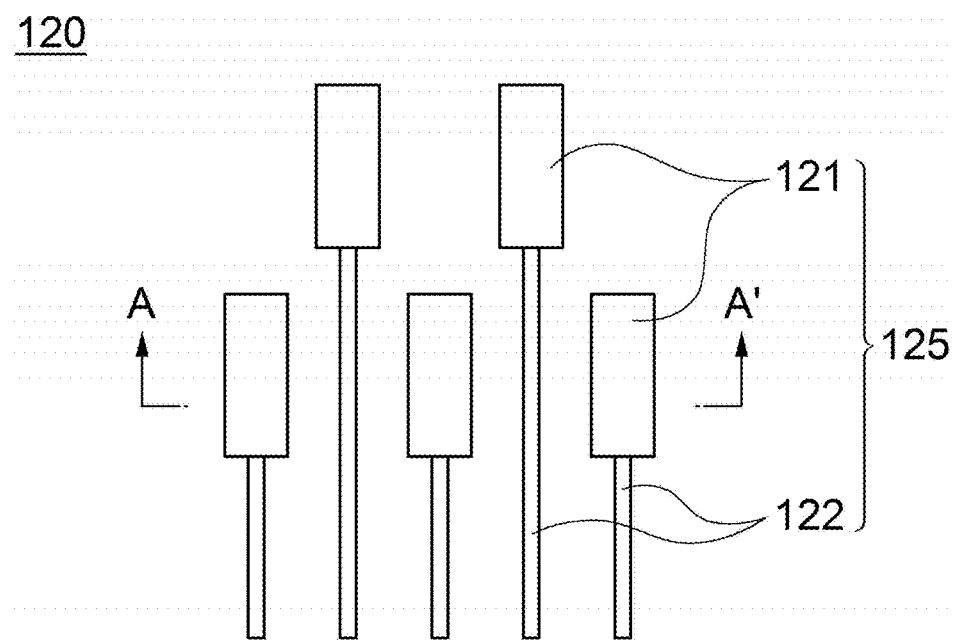
FIG. 4 is a plan view of the package substrate according to an exemplary embodiment of the present invention.
Figure 5:
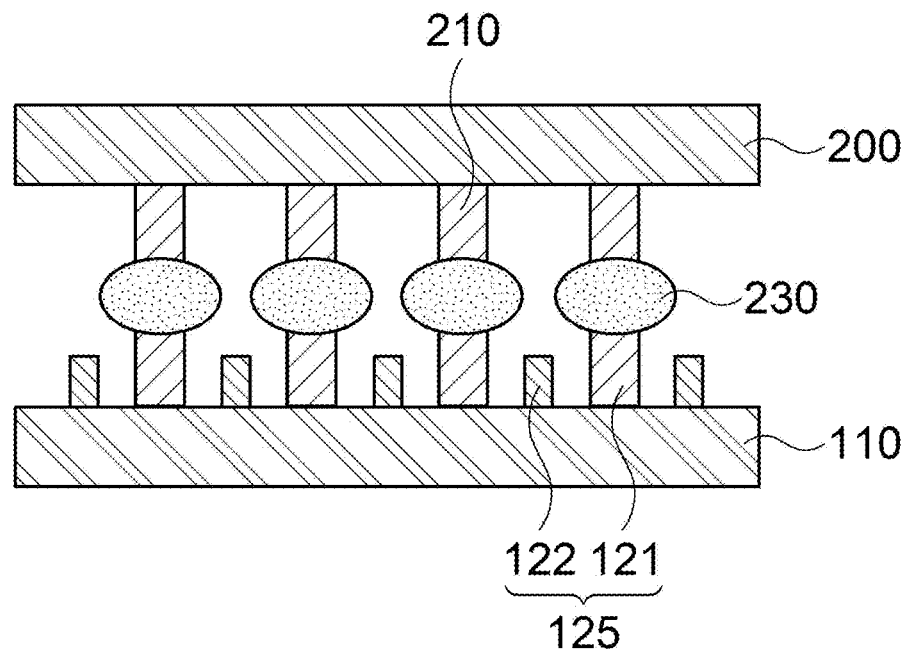
FIG. 5 is a cross-sectional view taken along line A-A' of FIG. 4 and schematically showing an electronic component bonding structure.

FIG. 4 is a plan view of the package substrate according to an exemplary embodiment of the present invention; and FIG. 5 is a cross-sectional view taken along line A-A' of FIG. 4 and schematically showing an electronic component bonding structure.

As shown in FIGS. 4 and 5, the circuit patterns 120 formed on the insulating layer 110 of the package substrate 100 may be configured in a peripheral type. The respective circuits 125 configuring the peripheral type circuit patterns 120 may be divided into pattern areas 122 and pad areas 121, and may comprise the pattern areas 122 having a line form and the pad areas 121 having a bump form.

Here, in the respective circuits 125 configuring the circuit patterns 120, the pattern areas 122 and the pad areas 121 may form a step therebetween to have different heights. That is, the pad areas 121 having the bump form may be higher than the pattern areas 122 having the line form. The pad areas 121 may be formed at end sides of the pattern areas 122.

In addition, the circuit pattern 120 may include a plurality of circuits 125 arranged in a row, wherein the respective circuits 125 may alternately have different lengths and be arranged in parallel with each other. In more detail, as shown in FIG. 4, any one of adjacent circuits 125 configuring the circuit pattern 120 may have a short pattern length, and the other thereof may a long pattern length. Therefore, in the circuit pattern 120 according to an exemplary embodiment of the present invention, the circuits having the short pattern length and the circuits having the long pattern length may be alternately disposed, and the pad areas 121 relatively higher than the pattern areas 122 may be formed at end portions of the respective circuits 125. Here, the sizes and lengths of the pad areas 121 formed in the respective circuits 125 can be the same as each other, respectively.

When the plurality of circuits 125 are arranged in parallel with each other in the circuit pattern 120, they need to be arranged so that the pad areas 121 formed in the respective circuits 125 do not overlapped with pad areas 121 adjacent thereto. To this end, the pad area 121 of the circuit 125 having the short pattern length may be disposed at one side of the pattern area 122 of the circuit 125 having the long pattern length. That is, the pattern areas 122 of the circuits 125 having the length pattern length may be disposed at both sides of the pad area 121 of the circuit 125 having the short pattern length.

Meanwhile, as shown in FIG. 5, the die 200 having the pad 210 such as an integrated circuit (IC), a semiconductor chip, or the like, may be mounted on the package substrate 100 including the circuit patterns 120 formed on the insulating layer 110. The pad 210 formed on the die 200 is to electrically connect the package substrate 100 and the die 200 to each other and may be replaced by an electrical connection means such as a bump, a solder ball, or the like.

The pad areas 121 of the respective circuits 125 of the circuit patterns 120 are electrically connected to the pads 210 of the die 200, and only the pad areas 121 higher than the pattern areas 122 configuring the respective circuits 125 are connected to the pads 210 of the die by conductive adhesives 230 interposed therebetween, such that the die 200 may be mounted on the package substrate 100.

As described above, when the die 200 is bonded onto the package substrate 100, the pad areas 121 of the circuit patterns 120 in which the circuits 125 are arranged in a row are bonded to the pads 210 of the die 200 to allow the conductive adhesives 230 not to contact the pattern areas 122 adjacent to the pad areas 121, thereby making it possible to prevent a defect such as a short-circuit between the circuits 125 while implementing a fine pitch of the circuit patterns 120.

The reason is that the pads 210 of the die 200 are connected to the pad areas 121 having a height relatively higher than that of the pattern areas 122, such that the possibility that the conductive adhesives 230 leaked to the outside of the pads will contact pattern areas 122 having a relatively low height and adjacent to the pad areas 121 is decreased.

In addition, only the pad areas 121, which are partial sections of the respective circuits 125 configuring the circuit patterns 120, are formed at a high height, and the pattern areas 122 connecting the pad areas 121 to each other in a line form are formed at a height lower as compared with the pattern according to the related art, which may be advantageous for forming a fine pitch. Here, the NCP 300 (See FIGS. 1 and 2), which is an insulating layer, may be interposed between the package substrate 100 and the die 200 to easily implement the circuit patterns 120 having the fine pitch.

The reason is that only the pad areas 121, which are portions of the respective circuits 125 configuring the circuit patterns 120, are formed at the high height, and the pattern areas 122 connecting the pad areas 121 to each other are formed at the low height, thereby making it possible to prevent generation of voids in the NCP filled between the package substrate 100 and the die 200.

When the pattern areas 122 of the circuit patterns 120 are formed at the low height, air bubbles, that is, voids, generated by air introduced at the time of applying the NCP between the package substrate 100 and the die 200 may easily escape to the outside of the circuit patterns, such that the voids may be easily removed.

Further, in accordance with an aspect of the invention, production of the package substrate 100, may be carried out such that separate plating treatment using tin (Sn) is not performed on the pad areas 121 of the respective circuits 125 configuring the circuit patterns 120, in order to minimize a bonding thickness between the pads. This is to decrease the probability of a short-circuit between the conductive adhesive and the adjacent pattern area 122 that will be generated since a space in which the conductive adhesive 230 is interposed is narrowed to increase an amount of leaked conductive adhesive 230 in the case of performing tin plating on the pad areas 121 of the respective circuits 125 as in the pads 210 of the die 200 in a state in which a package height in a state in which the die 200 is mounted on the package substrate 100 is limited.

Meanwhile, the NCP, which is the insulating material, is used at the time of mounting the die 200 on the package substrate 100, such that the plating treatment may not be performed on upper surfaces of the pad areas 121. Therefore, the short-circuit due to the conductive adhesive 230 interposed between the pads may be prevented as described above.

That is, in the package substrate 100 according to an exemplary embodiment of the present invention, when the die 200 is mounted on the package substrate 100 on which the circuit patterns 125 are formed, the NCP, which is the insulating material, is interposed between the package substrate 100 and the die 200, such that the package substrate 100 and the die 200 may be bonded to each other.

Here, the NCP, which is the insulating bonding material, includes fillers, which may be interposed at bonded portions between pads. In this case, distortion or delamination of the bonded portions may be generated due to a trap phenomenon by the fillers interposed between the pad areas 121 of the circuit patterns 120 and the pads 210 of the die 200. The upper surfaces of the pad areas 121 of the respective circuits 125 can be formed so as to have a surface roughness less than about 0.5 μm in order to prevent the distortion or the delamination.

The surface roughness formed on the pad areas 121 between the pad areas 121 and the pads 210 of the die 200 is maintained so as to be less 0.5 μm, thereby making it possible to prevent generation of an open defect between the pads due to the trap phenomenon caused by the introduction of the fillers included in the NCP between the pad areas 121 and the pads 210. In this case, the surface roughness of the pad areas 121 can be in a range of about 0.01 μm to about 0.5 μm.

To this end, bonded portions between the pad areas 121 of the circuit patterns 120 and the pads 210 of the die 200 were examined by X-section, and it could be appreciated through the examination that in the case in which the upper surfaces of the pad areas 121 of the circuit patterns 120 have the surface roughness less than about 0.5 μm, the trap phenomenon is not generated, such that bonding reliability between the pads is improved, as shown in Table 1.

TABLE 1

| Peripheral bump pad Roughness | Average NCP Filler Trap Number | sampling size | Examination Method |
|---|---|---|---|
| 0.90~1.0 um | 21.4 | 50 | X-section |
| 0.80~0.89 um | 17.2 | 50 | X-section |
| 0.70~0.79 um | 13.1 | 50 | X-section |
| 0.60~0.69 um | 9.8 | 50 | X-section |
| 0.50~0.59 um | 3.2 | 50 | X-section |
| 0.40~0.49 um | 0.0 | 50 | X-section |
| 0.30~0.39 um | 0.0 | 50 | X-section |
| 0.20~0.29 um | 0.0 | 50 | X-section |

Meanwhile, a molding part (not shown) for protecting the die 200 from an external environment may be further formed on the package substrate 100 in a state in which the die 200 is bonded to the package substrate 100.

As set forth above, in the package substrate according to exemplary embodiments of the present invention, the circuit patterns formed on the insulating layer are implemented so as to have peripheral type fine pitches having different lengths, the respective circuits are divided into the pattern areas and the pad areas having the step therebetween, and only the pad areas are connected to the pads of the die at the time of mounting an electronic component, thereby making it possible to prevent a short-circuit between adjacent circuits.

In addition, the surface roughness of the upper surfaces of the pad areas configuring the circuits is less than about 0.5 μm to prevent the open defect between the pads due to the trap phenomenon at the time of using the NCP, thereby making it possible to improve connection reliability between the circuit patterns and the die.

Although exemplary embodiments of the present invention have been disclosed for illustrative purposes, those skilled in the art will appreciate that various modifications, additions and substitutions are possible, without departing from the scope and spirit of the invention as disclosed in the accompanying claims. Accordingly, such modifications, additions and substitutions should also be understood to fall within the scope of the present invention.

What is claimed is:

1. A package substrate comprising:
    an insulating layer;
    circuit patterns formed on the insulating layer and divided into pad areas and pattern areas that have different heights; and
    a non-conductive paste (NCP) interposed between the circuit patterns and pads of a die connected to the circuit patterns to fix the die onto the insulating layer,
    wherein the circuit patterns are configured in a peripheral type, and the pad areas and the pattern areas form a step therebetween, such that the pad areas have a height higher than that of the pattern areas, and
    wherein the circuit pattern includes a plurality of circuits each including a respective pad area and a respective pattern area and arranged in a row, the respective circuits alternately having different lengths and being arranged substantially in parallel with each other.

2. The package substrate according to claim 1, wherein circuits having a short pattern area length and circuits having a long pattern area length are alternately disposed as the circuits.

3. A package substrate comprising:
    an insulating layer;

circuit pattern areas formed on the insulating layer; and pad areas formed on the insulating layer, the pad areas being alternately disposed with the circuit pattern areas and having a height greater than that of the circuit pattern areas.

4. The package substrate according to claim 3, wherein each of the circuit pattern areas is a circuit pattern line portion, the circuit pattern areas are substantially in parallel with each other and with additional circuit pattern line portions connected to the pad areas, and the pad areas and the circuit pattern areas are part of a peripheral type circuit pattern arrangement.

5. The package substrate according to claim 4, wherein bottom base surfaces of the pad areas and bottom base surfaces of the pad areas are in contact with the insulating layer.

6. An assembly comprising:

the package substrate according to claim 3; and a die having pads connected to the pad areas of the package substrate, the pads of the die being at positions corresponding to those of the pad areas of the package substrate.

7. The assembly of claim 6, wherein the pads of the die are connected to the pad areas of the package substrate through a conductive adhesive interposed between the pad areas and the pads of the die.

8. The assembly of claim 6, wherein a non-conductive paste (NCP) is interposed between the insulating layer and the pads of the die to fix the die to the insulating layer.

9. The package substrate according to claim 3, further comprising a solder resist covering the insulating layer as well as some of the circuit pattern areas and some of the pad areas.

10. The package substrate according to claim 3, wherein the pad areas have substantially the same size and length as each other.

11. The package substrate according to claim 3, wherein upper surfaces of the pad areas have a surface roughness less than about 0.5 µm.

12. The assembly of claim 6, wherein a tin plating layer is formed on the pads of the die.

13. The assembly of claim 12, wherein no tin plating layer is formed on the pad areas.

* * * * *